US 6,843,685 B1

(12) United States Patent
Borgstrom et al.

(10) Patent No.: US 6,843,685 B1
(45) Date of Patent: Jan. 18, 2005

(54) ELECTRICAL CONNECTOR WITH VOLTAGE DETECTION POINT INSULATION SHIELD

(75) Inventors: Alan Borgstrom, Hackettstown, NJ (US); John Knight, Placitas, NM (US)

(73) Assignee: Thomas & Betts International, Inc., Wilmington, DE (US)

( * ) Notice: Subject to any disclaimer, the term of this patent is extended or adjusted under 35 U.S.C. 154(b) by 0 days.

(21) Appl. No.: 10/745,840

(22) Filed: Dec. 24, 2003

(51) Int. Cl.$^7$ .............................................. H01R 13/58
(52) U.S. Cl. ........................ 439/606; 439/88; 439/921; 439/912
(58) Field of Search ................................ 439/181, 183, 439/184, 88, 89, 190, 921, 912, 205, 201, 604, 606, 186

(56) References Cited

U.S. PATENT DOCUMENTS

| | | | | |
|---|---|---|---|---|
| 4,067,636 A | * | 1/1978 | Boliver et al. | 439/184 |
| 4,161,012 A | * | 7/1979 | Cunningham | 361/128 |
| 4,175,815 A | * | 11/1979 | Andersen et al. | 439/89 |
| 4,202,591 A | * | 5/1980 | Borgstrom | 439/185 |
| 4,210,381 A | * | 7/1980 | Borgstrom | 439/161 |
| 4,222,625 A | * | 9/1980 | Reed | 439/89 |

(List continued on next page.)

*Primary Examiner*—Ross Gushi
(74) *Attorney, Agent, or Firm*—Hoffmann & Baron, LLP

(57) ABSTRACT

An electrical cable connector having a voltage detection test point generally includes an internal conductor, an inner insulating sheath surrounding the conductor, a conductive outer shield surrounding the insulating sheath, a separately molded plastic insulative shield disposed adjacent an opening formed in the conductive outer shield and held by the inner insulating sheath and a conductive voltage detection test point terminal disposed within the plastic insulative shield, wherein the test point terminal is capacitively coupled to the internal conductor for external testing of a voltage of the connector. In a preferred method for forming an electrical cable connector, such as a loadbreak power cable elbow connector, having a voltage detection test point, an insulative shield is first molded from a thermoplastic and a conductive voltage detection test point terminal is inserted within the plastic insulative shield. An outer shield is then molded from a conductive material. The conductive outer shield has an opening formed therethrough for accommodating the pre-assembled insulative plastic shield and test point terminal. After the pre-assembled insulative plastic shield and test point terminal are positioned adjacent the opening of the conductive outer shield, and after the conductive outer shield and an internal conductor are positioned within a mold cavity, an inner insulative housing is molded within the conductive outer shield and around the internal conductor. Upon molding, the pre-assembled insulative plastic shield and the test point terminal is held to the inner insulative housing. As a result, the test point terminal becomes capacitively coupled to the internal conductor for external testing of a voltage of the connector.

15 Claims, 6 Drawing Sheets

U.S. PATENT DOCUMENTS

| | | | | |
|---|---|---|---|---|
| 4,354,721 | A | * | 10/1982 | Luzzi .......................... 439/475 |
| 4,714,438 | A | * | 12/1987 | Williams ..................... 439/610 |
| 4,722,694 | A | * | 2/1988 | Makal et al. ................ 439/181 |
| 4,794,331 | A | * | 12/1988 | Schweitzer, Jr. ............ 324/133 |
| 4,814,933 | A | | 3/1989 | Filter et al. |
| 4,867,687 | A | * | 9/1989 | Williams et al. .............. 439/10 |
| 4,946,393 | A | * | 8/1990 | Borgstrom et al. ........... 439/88 |
| 5,082,449 | A | * | 1/1992 | Borgstrom et al. ........... 439/88 |
| 5,092,798 | A | * | 3/1992 | Muench ...................... 439/805 |
| 5,114,357 | A | * | 5/1992 | Luzzi .......................... 439/183 |
| 5,116,265 | A | * | 5/1992 | Brown et al. ............... 439/801 |
| 5,215,475 | A | * | 6/1993 | Stevens ...................... 439/206 |
| 5,221,220 | A | * | 6/1993 | Rosciezewski .............. 439/843 |
| 5,277,605 | A | * | 1/1994 | Rosciezewski et al. ....... 439/184 |
| 5,393,240 | A | * | 2/1995 | Makal et al. ................ 439/187 |
| 5,421,750 | A | * | 6/1995 | Crotty ........................ 439/801 |
| 5,445,533 | A | * | 8/1995 | Rosciezewski et al. ....... 439/184 |
| 5,525,069 | A | * | 6/1996 | Rosciezewski et al. ....... 439/184 |
| 5,573,410 | A | * | 11/1996 | Stepniak ...................... 439/88 |
| 5,655,921 | A | * | 8/1997 | Makal et al. ............... 439/206 |
| 5,846,093 | A | * | 12/1998 | Muench et al. ............... 439/89 |
| 5,857,862 | A | * | 1/1999 | Muench et al. ............. 439/181 |
| 6,042,407 | A | * | 3/2000 | Scull et al. ................. 439/181 |
| 6,213,799 | B1 | * | 4/2001 | Jazowski et al. ........... 439/181 |
| 6,231,404 | B1 | * | 5/2001 | Lichy ......................... 439/811 |
| 6,332,785 | B1 | * | 12/2001 | Muench et al. ............... 439/88 |
| 6,338,637 | B1 | * | 1/2002 | Muench et al. ............. 439/201 |
| 6,416,338 | B1 | * | 7/2002 | Berlovan .................... 439/187 |
| 6,491,548 | B2 | * | 12/2002 | Stepniak et al. ............ 439/622 |
| 6,504,103 | B1 | * | 1/2003 | Meyer et al. ............... 174/167 |
| 6,517,366 | B2 | * | 2/2003 | Bertini et al. ............... 439/190 |
| 6,585,531 | B1 | * | 7/2003 | Stepniak et al. ............ 439/187 |
| 6,744,255 | B1 | * | 6/2004 | Steinbrecher et al. ....... 324/511 |
| 6,790,063 | B2 | * | 9/2004 | Jazowski et al. ........... 439/181 |
| 2002/0164896 | A1 | | 11/2002 | Borgstrom et al. |

* cited by examiner

ELECTRICAL CONNECTOR WITH VOLTAGE DETECTION POINT INSULATION SHIELD

BACKGROUND OF THE INVENTION

1. Field of the Invention

The present invention relates to electrical cable connectors, such as loadbreak connectors and deadbreak connectors, and more particularly to an electrical cable connector, such as a power cable elbow connector, having a voltage detection point insulation shield, which is provided during a molding process to preserve the critical electrical interfaces of the connector.

2. Description of the Prior Art

Loadbreak cable connectors used in conjunction with 15, 25 and 35 kV switchgears generally include a power cable elbow connector having one end adapted for receiving a power cable and another end adapted for receiving a loadbreak bushing insert. The end adapted for receiving the bushing insert generally includes an elbow cuff for providing an interference fit with a molded flange on the bushing insert. This interference fit between the elbow cuff and the bushing insert provides a moisture and dust seal therebetween. An indicator band may be provided on a portion of the loadbreak bushing insert so that an inspector can quickly visually determine proper assembly of the elbow cuff and the bushing insert.

Such loadbreak elbows typically comprise a conductor surrounded by a semiconducting layer and an insulating layer, all encased in a semiconductive outer shield. The elbow connector further includes a test point terminal embedded in the insulating sheath and exposed for contact from outside of the shield. A voltage on the conductor capacitively couples a first voltage on the test point terminal and a second voltage on the outer shield.

Service personnel commonly encounter difficulty in reliably determining whether or not a voltage is present on a loadbreak elbow. This is of considerable importance, since the safety of service personnel effecting service on such a system may depend upon the reliability of a status indicator correctly indicating the status of the connector to prevent electrical shock hazards.

A variety of indicating devices for such purpose are known. These devices must be carefully employed in order to avoid electrical shock and draw a current from the conductor being tested which can affect the voltage reading. Failure of the device could indicate a false voltage status which may lead service personnel to assume that there is no voltage on the conductor when a voltage is in fact present, which presents an obvious safety hazard.

Electrical shock hazards can also arise when the test point terminal and the area surrounding the terminal are not carefully manufactured or are subject to debris and contaminants. For example, irregularities, voids and even mold parting lines formed in the surfaces surrounding the voltage test point terminal may increase the chances of an electrical short and/or failure. Such irregularities in these surfaces further often interfere with effective sealing of the protective cap used to cover the terminal when not in use. Without an effective seal, dirt and other contaminants may find their way to the terminal, which presents a safety and performance hazard.

These concerns are significant given the problems typically encountered during manufacturing of these types of connectors. Typically, these connectors are made by injection molding of a rubber or an epoxy material wherein the critical electrical interfaces adjacent the voltage detection point are formed by molding the material against a metal mold surface. To prevent the material from sticking to the mold surface, release agents are typically sprayed in the mold cavities. Once cured, the connector is removed from the mold and, due to the nature of the molding material, a considerable amount of mold flashing must be trimmed. Even when trimmed properly, mold parting lines on the connector interface surfaces may disrupt the required protective cap seal and result in an electrical short. Also, the mold cavities are typically prone to contaminants, which may in turn be imparted onto the electrical interface of the connector resulting in a scrapped part.

Accordingly, it would be advantageous to provide a method for manufacturing a molded electrical connector which reduces or prevents the aforesaid manufacturing problems. It would also be desirable to provide an electrical cable connector having an improved insulation shield adjacent the connector's voltage detection point terminal which enhances safety and performance.

OBJECTS AND SUMMARY OF THE INVENTION

It is an object of the invention to provide an electrical cable connector, such as a power cable elbow connector, having an improved insulation shield adjacent the connector's voltage detection point.

It is a further object of the invention to provide an electrical cable connector with a plastic shell disposed on a voltage detection point interface surface thereof to reduce friction between the interface surface and a protective cap inserted thereon.

It is still a further object of the present invention to provide an improved method of manufacturing an electrical cable connector which reduces the possibility of contaminants and irregularities on the critical electrical interfaces of the connector adjacent the connector's voltage detection point, and which further reduces mold tool wear and cleaning.

In accordance with a preferred form of the present invention, an electrical cable connector having a voltage detection test point generally includes an internal conductor, an inner insulating sheath surrounding the conductor, a conductive outer shield surrounding the insulating sheath, a separately molded plastic insulative shield disposed adjacent an opening formed in the conductive outer shield and held by the inner insulating sheath and a conductive voltage detection test point terminal disposed within the plastic insulative shield, wherein the test point terminal is capacitively coupled to the internal conductor for external testing of a voltage of the connector.

Preferably, the conductive outer shield has a circular opening formed therethrough and the plastic insulative shield is an annular ring substantially surrounding the voltage detection test point terminal. The connector further preferably includes a removable semiconducting protective cap substantially encapsulating the plastic insulative shield and the test point terminal to protect the critical electrical interface surfaces from dirt and other contaminants.

The plastic insulative shield is preferably made from a low coefficient of friction plastic material which is a different color than that of the conductive outer shield to provide an indication of an operating voltage of the connector. Also, the plastic insulative shield preferably includes structure which engages cooperating structure provided on the test point terminal for pre-assembling the terminal to the plastic insulative shield prior to bonding the pre-assembled terminal and plastic insulative shield to the inner insulating sheath.

In an alternative embodiment, the plastic insulative shield is simply held to the outer conductive shield. In this case, it is not necessary to form an opening in the outer shield to accommodate the plastic insulative shield.

In a preferred method for forming an electrical cable connector, such as a loadbreak power cable elbow connector, having a voltage detection test point, an insulative shield is first molded from a thermoplastic and a conductive voltage detection test point terminal is inserted within the plastic insulative shield. An outer shield is then molded from a conductive material. The conductive outer shield has an opening formed therethrough for accommodating the pre-assembled insulative plastic shield and test point terminal. After the pre-assembled insulative plastic shield and test point terminal are positioned adjacent the opening of the conductive outer shield, and after the conductive outer shield and an internal conductor are positioned within a mold cavity, an inner insulative housing is molded within the conductive outer shield and around the internal conductor. Upon molding, the pre-assembled insulative plastic shield and the test point terminal is held to the inner insulative housing. As a result, the test point terminal becomes capacitively coupled to the internal conductor for external testing of a voltage of the connector.

Placing the pre-assembled insulative plastic shield and test point terminal within the housing mold prior to molding the inner insulative housing provides one or more of the following benefits during molding of the housing. The plastic shield provides a barrier against contamination of the housing. The plastic shield provides a barrier against the formation of mold parting lines in the housing. The plastic shield provides a barrier against the formation of mold flashing on the housing and the plastic shield provides a barrier against the formation of surface disruptions on said housing.

A preferred form of the electrical connector, as well as other embodiments, objects, features and advantages of this invention, will be apparent from the following detailed description of illustrative embodiments thereof, which is to be read in conjunction with the accompanying drawings.

DETAILED DESCRIPTION OF ILLUSTRATIVE EMBODIMENTS

Figure 1:
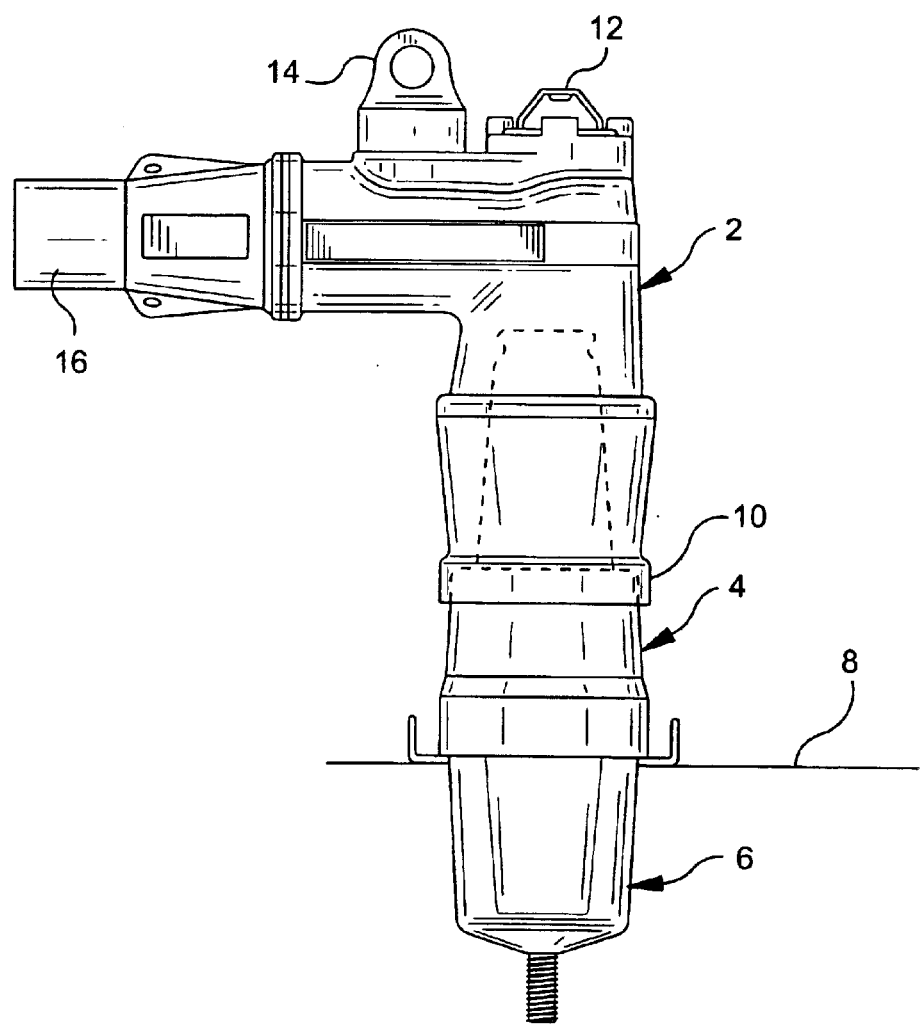
FIG. 1 is a side view of prior art loadbreak connectors, namely, a power cable elbow, a loadbreak bushing insert and a universal bushing well.
Figure 2:
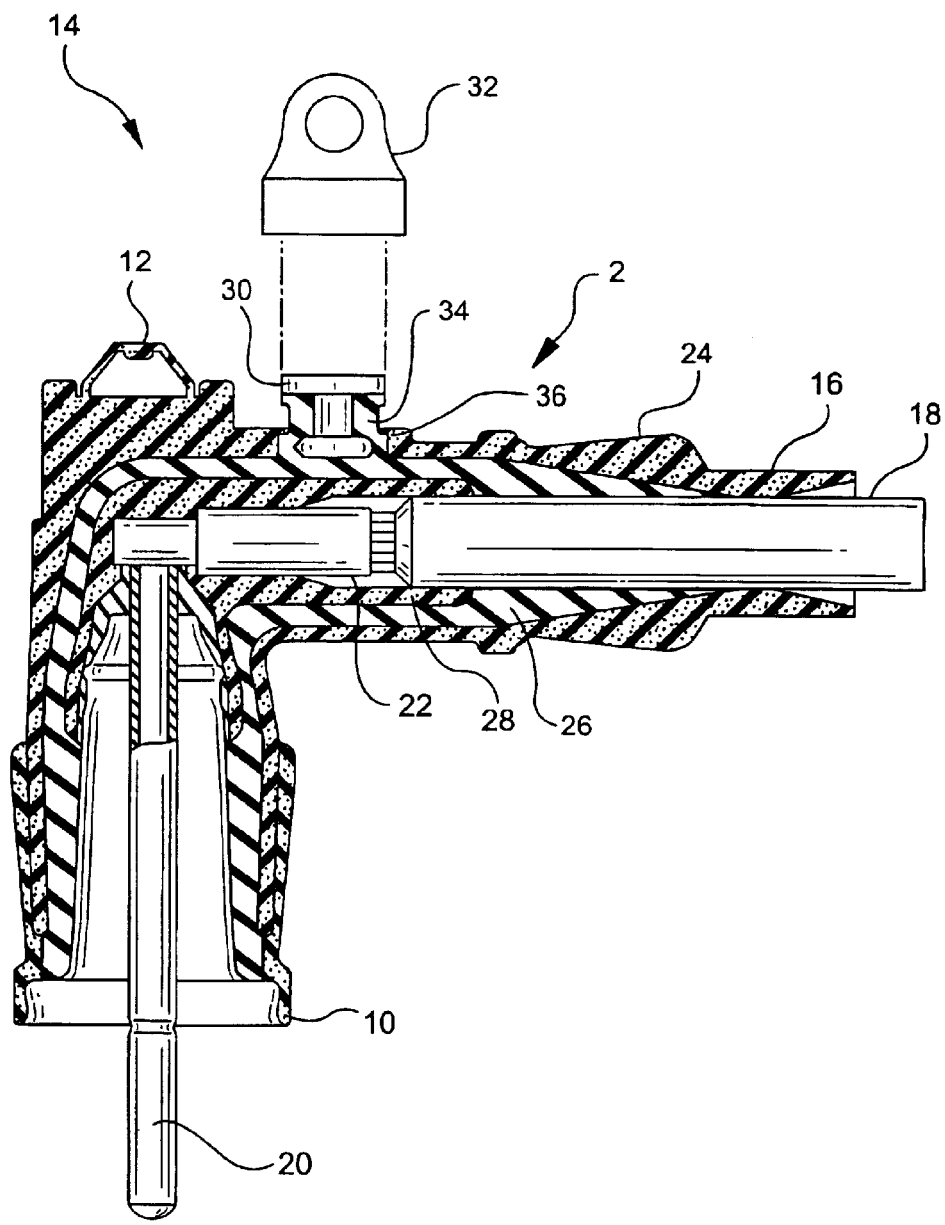
FIG. 2 is a cross-sectional view of the prior art power cable elbow connector shown in FIG. 1.

Referring first to FIGS. 1 and 2, prior art loadbreak connectors are illustrated. In FIG. 1, a power cable elbow connector 2 is illustrated coupled to a loadbreak bushing insert 4, which is seated in a universal bushing well 6. The bushing well 6 is seated on an apparatus face plate 8. The power cable elbow connector 2 includes a first end adapted for receiving a loadbreak bushing insert 4 and having a flange or elbow cuff 10 surrounding the open receiving end thereof. A power cable receiving end 16 is provided at the opposite end of the power cable elbow connector and a conductive member extends from the power cable receiving end to the bushing insert receiving end 10 for connection to a probe insertion end of the bushing insert.

FIG. 2 is a cross-sectional view of a prior art power cable elbow connector 2, which includes a cable receiving end 16 having a cable 18 therein. The other end of the power cable elbow is a loadbreak bushing insert receiving end 10 having a probe or energized electrode 20 positioned within a central opening of the bushing receiving end. The probe 20 is connected via a cable connector 22 to the cable 18. The power cable elbow 2 includes an electrically conductive shield 24 formed from a conductive peroxide-cured synthetic rubber, known and referred to in the art as EPDM. Within the shield 24, the power cable elbow 2 includes an insulative inner housing 26, typically molded from an insulative rubber or epoxy material, and within the insulative inner housing, the power cable elbow connector includes a conductive insert 28 which surrounds the connection portion 22 of the cable 18.

The power cable elbow connector also includes an opening eye 12 for providing hot-stick operation and a voltage detection test point 14 for testing voltage with appropriate voltage sensing devices. The voltage detection test point 14 includes a test point terminal 30 embedded in a portion 34 of the insulating sheath 26 that extends through an opening 36 within the conductive shield 24. The terminal 30, which is formed of a conductive metal or plastic, is exposed exterior to the conductive shield 24, but is separated from the shield by the insulating portion 34 surrounding the terminal. Thus, the test point terminal 30 is capacitively coupled to the electrical conductor elements within the connector. An insulating protective cap 32 sealingly engages the portion 34 of the insulating sheath 26 that extends through the conductive shield 24 about the test point terminal 30 to protect the terminal from environmental conditions.

As previously mentioned, to minimize the chances of electrical shock, it is important that the insulating portion 34 surrounding the terminal 30 be free of any surface irregularities and/or contaminants. Also, a smooth surface on the surrounding insulating portion 34 ensures an air and water tight seal with the protective cap 32. However, because of the nature of the material of the insulative sheath 26 and how it is typically molded, surface irregularities and contaminants on the portion 34 surrounding the terminal are not uncommon.

Specifically, in a typical molding process, a preformed conductive shield 24, the internal conductive members and a terminal 30 are positioned within a rubber or epoxy mold and the insulative rubber or epoxy is injected within the shield to form the inner insulative sheath 26. To form the voltage detection test point 14, the terminal 30 is held within the mold at a location adjacent the opening 36 of the conductive shield 24 and the insulative rubber or epoxy is allowed to flow through the opening to encapsulate the terminal. Thus, in the area of the portion 34 surrounding the terminal 30, the insulative rubber or epoxy comes into direct contact with the mold. As mentioned above, this results in mold parting lines, flash, contaminants, voids and other irregularities being formed on the surface of the terminal portion 34.

Referring now to FIGS. 3–6, the present invention eliminates the possibilities of such disruptions being formed on the terminal portion by providing a pre-molded plastic insulation shield 40, which is pre-assembled with the terminal 30 and, together with the terminal, is positioned within the insulative mold adjacent the conductive shield opening 36 to be held by the rubber or epoxy material injected within the conductive shield 24. Thus, the pre-molded insulation shield 40 becomes coextensive with the insulative sheath 26 upon molding and the rubber or epoxy material injected within the conductive shield does not come into contact with the mold surfaces in the area surrounding the terminal 30.

In a preferred embodiment, the pre-molded plastic insulation shield 40 is an annular ring formed, for example, by injection molding, blow molding or spin molding of an insulative material, such as glass-filled nylon. The chosen material is also preferably a low coefficient of friction material to reduce frictional forces between the interface surfaces upon assembly and disassembly of the protective cap 32. Also, the shield 40 may be separately molded from a different colored material than that of the outer conductive shield 24 to provide an indication of the operating voltage of the connector. For example, a red plastic shield may be indicative of a 15 kV loadbreak elbow connector while a blue shield may be indicative of a 25 kV connector and so on.

Figure 5:
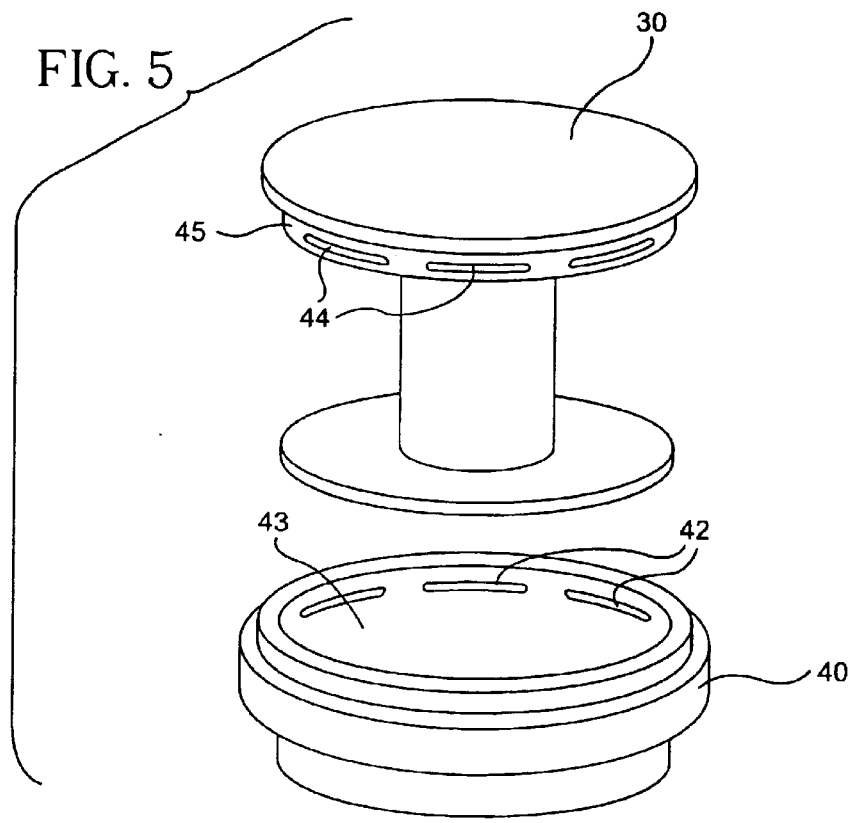
FIG. 5 is an exploded view of the voltage detection point insulation shield and terminal formed in accordance with the present invention.
Figure 6:
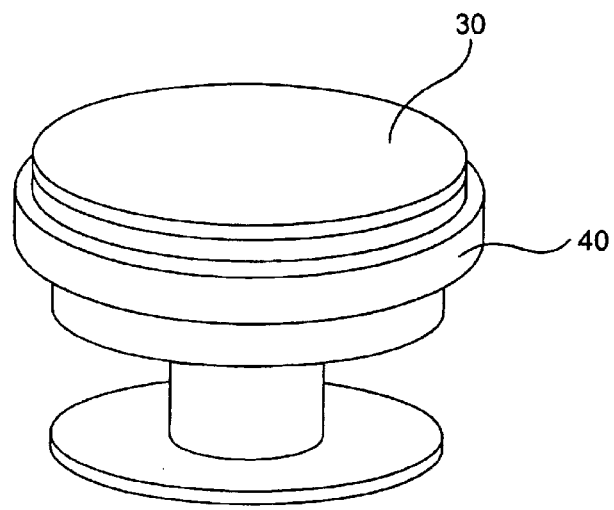
FIG. 6 is an enlarged assembled view of the voltage detection point insulation shield and terminal formed in accordance with the present invention.

The separately molded shield ring 40 further preferably includes some form of structure which engages the terminal 30 in a pre-assembled state. For example, the structure may include a raised rib or groove 42 formed on the inner annular surface 43 of the ring 40, which cooperates with a respective groove or rib structure 44 provided on an outer annular surface 45 of the terminal 30 so that the terminal can be snapped in place within the insulation shield 40 in a pre-assembled state, as shown in FIGS. 5 and 6.

Formation of the elbow connector is then carried out as described above. In particular, the internal conductive members 20, 22, 28 and the outer conductive shield 24 are first secured within a rubber or epoxy mold in their respective positions. The now pre-assembled insulation shield ring 40 and terminal 30 are also positioned within the mold adjacent the opening 36 of the conductive shield 24. An adhesion promoter may be applied to the shield ring 40 prior to molding to enhance bonding between the shield ring and the rubber or epoxy insulative material. Once all the connector components are in place, the insulative material is then injected within the conductive shield 24 to form the inner insulative sheath 26. The injected insulative material contacts the plastic material of the shield ring 40 through the opening 36 formed within the conductive shield 24 to hold the insulative shield ring in place. Thus, as opposed to the injection molded rubber or epoxy material forming the portion 34 surrounding the terminal 30, the insulation shield ring 40 provides the critical electrical interface surfaces for the voltage detection test point.

Figure 7:
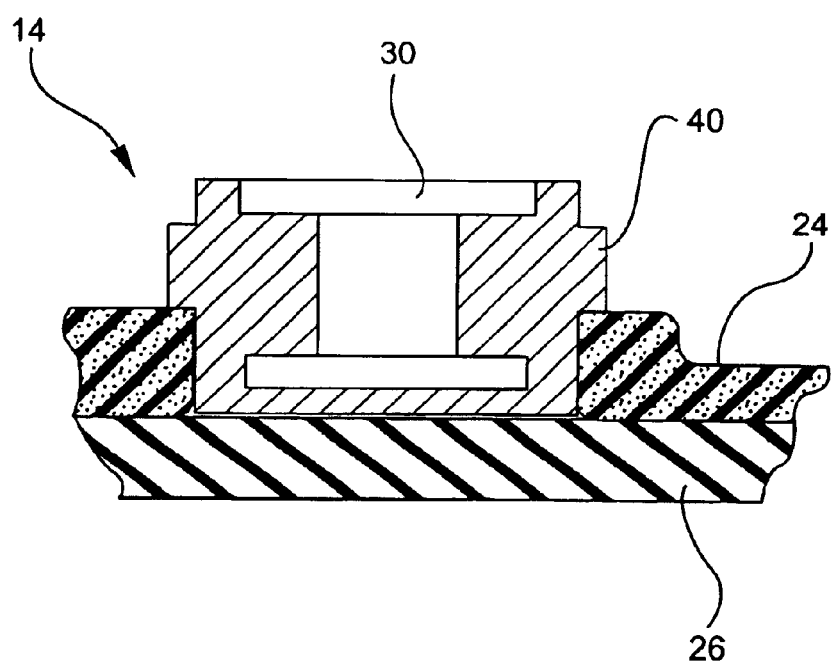
FIG. 7 is a cross-sectional view of an alternative embodiment of the voltage detection point insulation shield formed in accordance with the present invention.

As used herein, the phrase "held by" can refer to any means of securing the separately molded insulative shield ring 40 and the terminal 30 in place on the electrical connector. Thus, in the preferred embodiment as shown in FIGS. 3–6, the terminal 30 is shaped to be mechanically held by the insulative material forming the sheath housing 26 upon molding. Also, as mentioned above, adhesion promoters may be used so that the terminal 30 and/or ring 40 can be chemically bonded to the inner insulative housing 26 during molding. It is also conceivable that the terminal 30 and/or the plastic insulative shield 40 can be held to the inner housing 26 with a suitable adhesive applied after molding of the components, as shown in FIG. 7.

Additionally, in an alternative embodiment, the pre-assembled shield ring 40 and terminal 30 can instead be held to the outer conductive shield 24. This too can be achieved by providing structure which ensures that the shield ring 40 and the terminal 30 are mechanically held in place during molding, or by chemically bonding or otherwise adhering the shield directly to the outer conductive shield 24, so long as the terminal is electrically isolated from the outer conductive shield. In this embodiment, the opening 36 formed in the outer conductive shield 24 for accommodating the plastic shield ring 40 and terminal 30 would no longer be required.

However, it has been found that the preferred method according to the present invention provides considerable manufacturing benefits. In particular, by first separately molding a plastic voltage detection point insulation shield 40 and then placing the shield within a housing mold, wherein a rubber or epoxy inner housing is molded, several significant benefits can be achieved.

First, at the critical electrical interface surface on the exterior of the insulative portion surrounding the test point terminal 30, the rubber or epoxy housing material only comes into contact with the shield ring 40, as opposed to the cavity surfaces of the mold. Isolating the rubber or epoxy insulation material from the mold cavity in this area eliminates the possibility of contaminants from the mold surfaces being transferred to the critical electrical interface surfaces surrounding the voltage test point terminal 30, which typically results in a scrapped part.

Second, the pre-molded shield ring 40 placed within the rubber mold prevents excess flashing and eliminates mold parting lines at the critical electrical interface surfaces surrounding the voltage test point terminal 30. The rubber or epoxy material typically used to mold the inner housing sheath 26 tends to seep freely within the mold during the injection molding process regardless of the precision used in fabricating the mold. Thus, once cured after molding, any areas of the insulative housing that come into contact with a mold surface must be carefully trimmed of all rubber or epoxy flash. Aside from the time consuming and labor intensive process of trimming the excess flash, there is also the drawback of marring or disrupting the surface of the housing, which could result in electrical failure at high voltage. Moreover, even with the utmost care in removing the flash, mold parting lines may be left on the housing, which may result in an electrical short. By injection molding the rubber or epoxy material within the pre-formed conductive shell 24 and shield ring 40, these drawbacks are eliminated since the shell and the shield ring prevent the molding material from seeping and forming flash.

Third, minimizing the areas in which the rubber or epoxy material comes into contact with a mold surface further enhances the lifetime and cleanliness of the mold. With conventional rubber and epoxy molding of high voltage connectors, the injected material comes in direct contact with the mold surfaces. To prevent the rubber or epoxy from sticking to the mold, release agents are often applied to the mold cavities. Aside from the possibility of the release agents contaminating the finished molded part, these release agents can be abrasive and cause wear on the mold cavity surfaces. Moreover, despite the application of the release agent, the molded material, which is also abrasive, still often sticks to the mold which may result in voids or other irregularities being formed on a critical surface when the housing is removed from the mold. These voids and irregularities must then be patched to preserve the part. Additionally, the rubber and epoxy remnants, as well as the other gaseous by-products of the curing process, deposited on the mold surfaces require the mold to be cleaned regularly. The method according to the present invention minimizes mold cleaning and its associated costs and down time in manufacturing, as well as prolongs the life of the mold, by isolating the molding material from the mold surfaces.

Finally, because of the nature of the plastic material, smoother surface finishes can be achieved on the exterior of the shield ring 40, as compared to rubber or epoxy molded surfaces. By providing a smoother finish on the test point exterior surface that interfaces with the protective cap 32, a better air tight and water tight seal can be achieved. A strong seal prevents dirt or other contaminants from interfering with the test point terminal.

Figure 3:
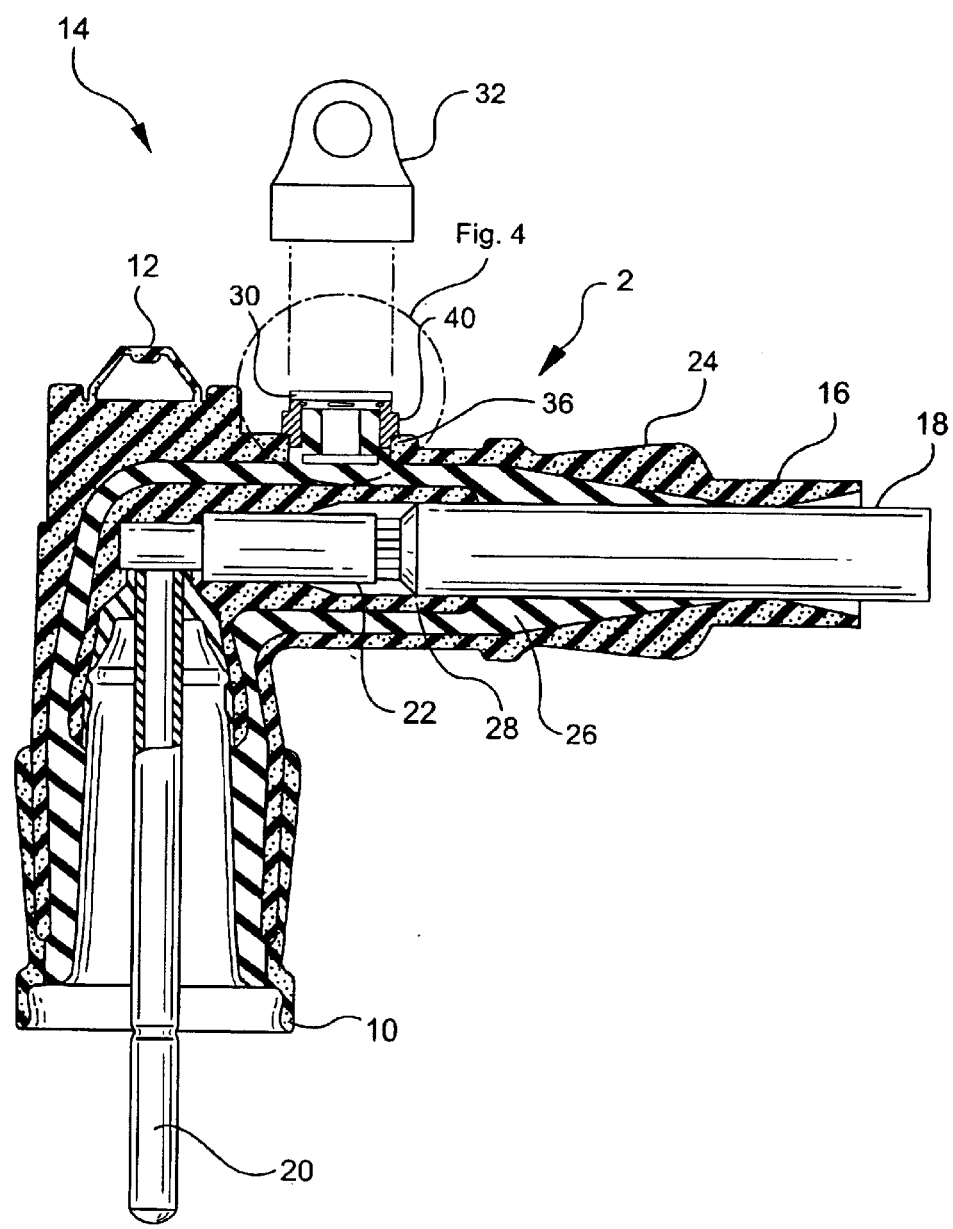
FIG. 3 is a cross-sectional view of an electrical cable connector, according to the present invention, in the form of a power cable elbow connector.
Figure 4:
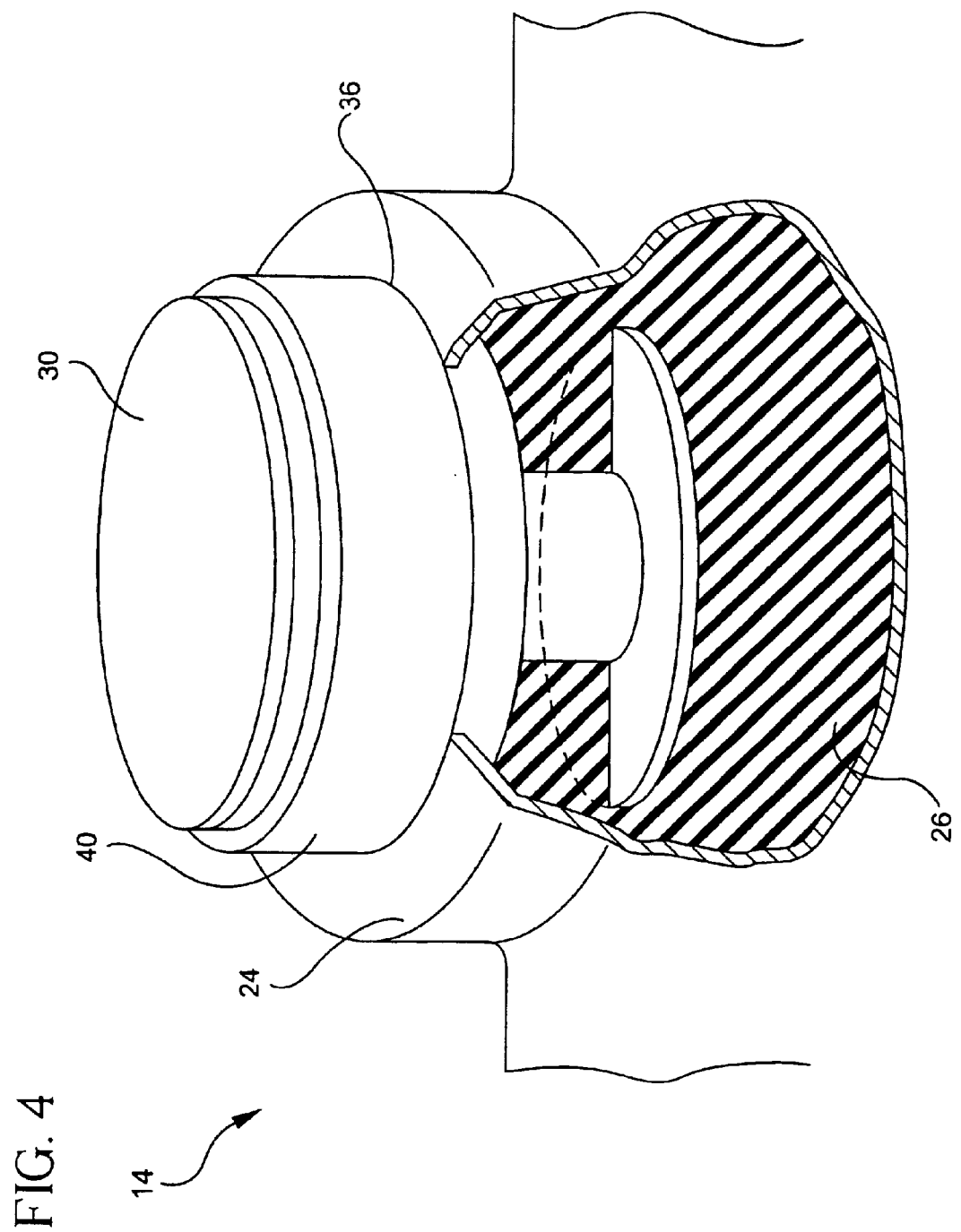
FIG. 4 is an enlarged partial cross-sectional view of the voltage detection point insulation shield formed in accordance with the present invention.

While the electrical connector discussed and shown in FIGS. 1–3 is a loadbreak elbow connector, the separately molded shield ring of the present invention can be utilized on interface surfaces of all types of electrical connectors to improve on the surface finish of critical electrical interface surfaces and to reduce the frictional forces encountered upon assembling and disassembling mating connectors. Thus, the present invention has particular application on such separable electrical connectors as loadbreak connectors and deadbreak connectors. However, the invention is not limited to these particular embodiments. It is within the scope of the present invention to use a low coefficient of friction ring, sleeve or other type of structure on any type of separable electrical connector system, wherein critical electrical interface surfaces are present and/or frictional forces are encountered upon assembly and disassembly.

Although the illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. An electrical connector having a voltage detection test point, the connector comprising:
   an internal conductor;
   an inner insulating sheath surrounding said conductor;
   a conductive outer shield surrounding said insulating sheath, said conductive outer shield having an opening formed therethrough;
   a separately molded plastic insulative shield disposed adjacent said opening of said conductive outer shield and held by said inner insulating sheath; and
   a conductive voltage detection test point terminal disposed within said plastic insulative shield, wherein said test point terminal is capacitively coupled to said internal conductor for external testing of a voltage of said connector.

2. An electrical connector as defined in claim 1, wherein said connector is a loadbreak power cable elbow connector.

3. An electrical connector as defined in claim 1, wherein said conductive outer shield has a circular opening formed therethrough and said plastic insulative shield is an annular ring substantially surrounding said voltage detection test point terminal.

4. An electrical connector as defined in claim 1, further comprising a removable protective cap substantially encapsulating said plastic insulative shield and said test point terminal.

5. An electrical connector as defined in claim 1, wherein said plastic insulative shield is made from a low coefficient of friction plastic material.

6. An electrical connector as defined in claim 1, wherein said plastic insulative shield includes structure which engages cooperating structure provided on said test point terminal for pre-assembling said terminal to said plastic insulative shield prior to bonding said pre-assembled terminal and plastic insulative shield to said inner insulating sheath.

7. An electrical connector as defined in claim 1, wherein said plastic insulative shield is separately molded from a different colored material than that of said conductive outer shield to provide an indication of an operating voltage of said connector.

8. An electrical connector having a voltage detection test point, the connector comprising:
   an internal conductor;
   an inner insulating sheath surrounding said conductor;
   a conductive outer shield surrounding said insulating sheath;
   a separately molded plastic insulative shield held by said conductive outer shield; and
   a conductive voltage detection test point terminal disposed within said plastic insulative shield, wherein said test point terminal is capacitively coupled to said internal conductor for external testing of a voltage of said connector.

9. An electrical connector as defined in claim 8, wherein said connector is a loadbreak power cable elbow connector.

10. An electrical connector as defined in claim 8, wherein said plastic insulative shield is an annular ring substantially surrounding said voltage detection test point terminal.

11. An electrical connector as defined in claim 8, further comprising a removable protective cap substantially encapsulating said plastic insulative shield and said test point terminal.

12. An electrical connector as defined in claim 8, wherein said plastic insulative shield is made from a low coefficient of friction plastic material.

13. An electrical connector as defined in claim 8, wherein said plastic insulative shield includes structure which engages cooperating structure provided on said test point terminal for pre-assembling said terminal to said plastic insulative shield prior to bonding said pre-assembled terminal and plastic insulative shield to said conductive outer shield.

14. An electrical connector as defined in claim 8, wherein said plastic insulative shield is separately molded from a different colored material than that of said conductive outer shield to provide an indication of an operating voltage of said connector.

15. A loadbreak power cable elbow connector having a voltage detection test point, said voltage detection test point including a flange having at least a portion of which colored to provide an indication of an operating voltage of the connector.

* * * * *